United States Patent
Kalt et al.

(10) Patent No.: US 11,958,369 B2
(45) Date of Patent: Apr. 16, 2024

(54) METHOD AND DEVICE FOR PREPARING A TRANSMISSION OF ENERGY TO A VEHICLE BY MEANS OF AN INDUCTIVE CHARGING SYSTEM

(71) Applicant: Vitesco Technologies GmbH, Hannover (DE)

(72) Inventors: Urs Kalt, Munich (DE); Andrees Beekmans, Munich (DE); Bernhard Michel, Munich (DE)

(73) Assignee: Vitesco Technologies GmbH (DE)

( * ) Notice: Subject to any disclaimer, the term of this patent is extended or adjusted under 35 U.S.C. 154(b) by 430 days.

(21) Appl. No.: 17/282,088

(22) PCT Filed: Oct. 1, 2019

(86) PCT No.: PCT/EP2019/076653
§ 371 (c)(1),
(2) Date: Apr. 1, 2021

(87) PCT Pub. No.: WO2020/070164
PCT Pub. Date: Apr. 9, 2020

(65) Prior Publication Data
US 2021/0370783 A1    Dec. 2, 2021

(30) Foreign Application Priority Data

Oct. 5, 2018 (DE) ..................... 10 2018 217 082.7

(51) Int. Cl.
*G01R 31/00* (2006.01)
*B60L 53/12* (2019.01)
(Continued)

(52) U.S. Cl.
CPC ............... *B60L 53/12* (2019.02); *B60L 53/60* (2019.02); *G01R 31/006* (2013.01); *G01R 31/72* (2020.01);
(Continued)

(58) Field of Classification Search
CPC ....... B60L 53/12; B60L 53/60; G01R 31/006; G01R 31/72; H01F 38/14; H02J 7/02;
(Continued)

(56) References Cited

U.S. PATENT DOCUMENTS 3,663,939 A * 5/1972 Olsson ................ G01R 31/006
361/48
4,394,741 A * 7/1983 Lowndes ........... G01R 31/3648
340/636.15
(Continued)

FOREIGN PATENT DOCUMENTS

CN 102055250 A 5/2011
CN 105493375 A 4/2016
(Continued)

OTHER PUBLICATIONS

Office Action (The First Office Action) issued Dec. 22, 2023, by the National Intellectual Property Administration, P. R. China in corresponding Chinese Patent Application No. 201980065549.X and an English translation of the Office Action. (24 pages).

*Primary Examiner* — Tung X Nguyen
*Assistant Examiner* — Robert P Alejnikov, Jr.
(74) *Attorney, Agent, or Firm* — Buchanan Ingersoll & Rooney PC

(57) ABSTRACT

A method for preparing a transmission of energy to a vehicle by an inductive charging system, which has a base plate arranged on a primary side of the charging system and a secondary side arranged in or on the vehicle. A first coil is provided in the base plate and a second coil is provided on the secondary side in a vehicle plate. The method includes energizing the second coil provided on the secondary side from a vehicle-based power source and diagnosing the functionality of components arranged on the secondary side of the inductive charging system by evaluating the energization carried out on the secondary side of the inductive (Continued)

charging system. Also disclosed is a device for preparing a transmission of energy to a vehicle by an inductive charging system.

19 Claims, 1 Drawing Sheet

(51) Int. Cl.
*B60L 53/60* (2019.01)
*G01R 31/72* (2020.01)
*H01F 38/14* (2006.01)
*H02J 7/02* (2016.01)
*H02J 50/12* (2016.01)
*H02J 50/90* (2016.01)

(52) U.S. Cl.
CPC ............... *H01F 38/14* (2013.01); *H02J 7/02* (2013.01); *H02J 50/12* (2016.02); *H02J 50/90* (2016.02); *H02J 2310/48* (2020.01)

(58) Field of Classification Search
CPC ........ H02J 50/12; H02J 50/90; H02J 2310/48; H02J 50/10; Y02T 10/70; Y02T 10/7072; Y02T 90/12; Y02T 90/14
USPC ......................................................... 324/503
See application file for complete search history.

(56) References Cited

U.S. PATENT DOCUMENTS

| | | | |
|---|---|---|---|
| 8,716,974 | B2 | 5/2014 | Sakoda et al. |
| 10,065,513 | B2 | 9/2018 | Plum et al. |
| 10,112,496 | B2 | 10/2018 | Nguyen et al. |
| 10,538,165 | B2 | 1/2020 | Dadras et al. |
| 11,027,619 | B2 | 6/2021 | Maiwald et al. |
| 2015/0274023 | A1* | 10/2015 | Houivet ................ B60L 53/22 320/108 |
| 2016/0178740 | A1* | 6/2016 | Sieber .................... B60L 53/36 342/43 |
| 2016/0268841 | A1* | 9/2016 | Zeier ........................ H02J 7/02 |

FOREIGN PATENT DOCUMENTS

| | | | | |
|---|---|---|---|---|
| CN | 106877517 A | | 6/2017 | |
| CN | 107612157 A | | 1/2018 | |
| DE | 102012103322 A1 | * | 10/2013 | ............ B60L 11/182 |
| DE | 102012103322 A1 | | 10/2013 | |
| DE | 102015223230 A1 | * | 5/2017 | ................ B60L 3/12 |
| DE | 102015223230 A1 | | 5/2017 | |
| WO | 2018/046199 A1 | | 3/2018 | |

* cited by examiner

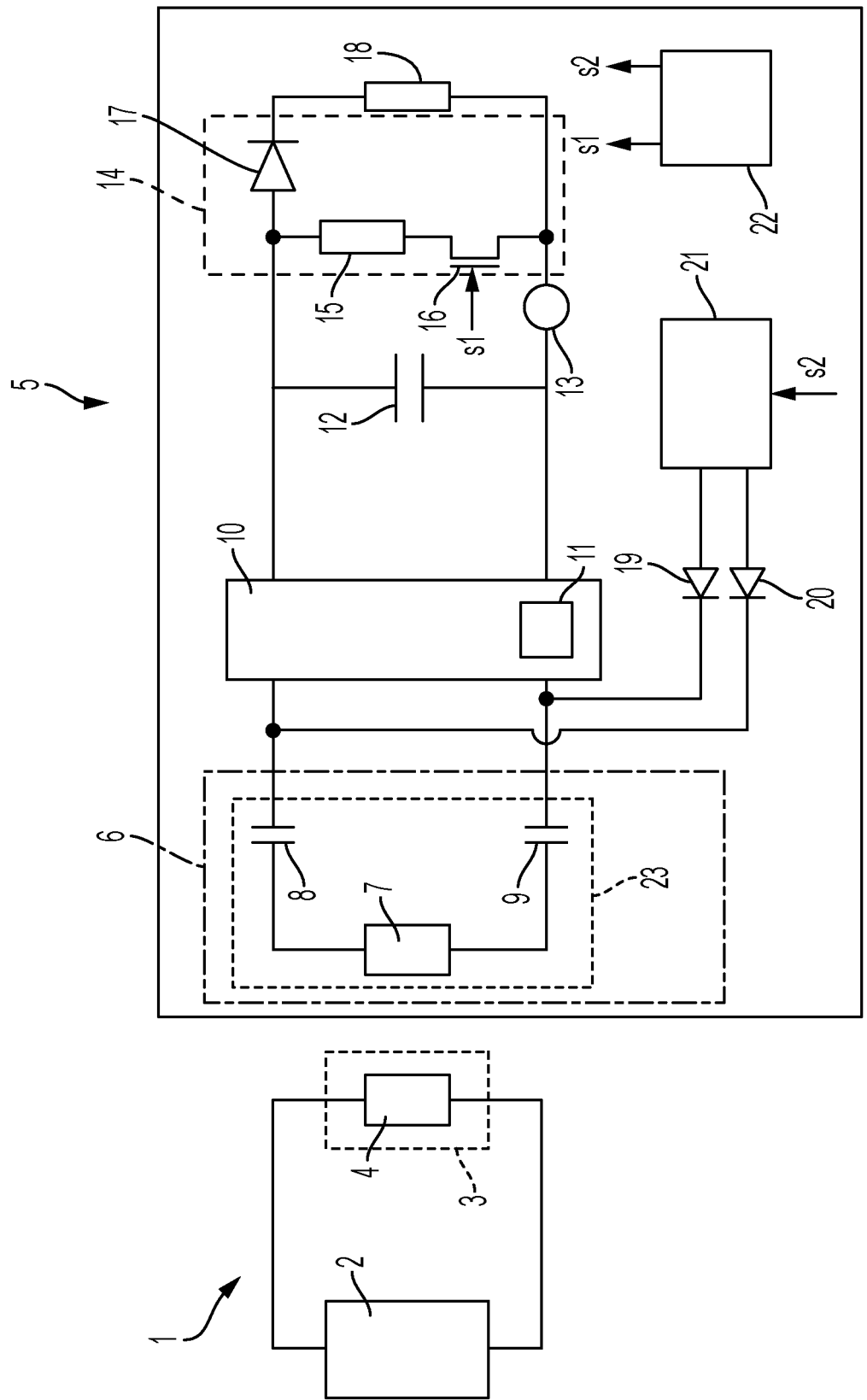

METHOD AND DEVICE FOR PREPARING A TRANSMISSION OF ENERGY TO A VEHICLE BY MEANS OF AN INDUCTIVE CHARGING SYSTEM

CROSS REFERENCE TO RELATED APPLICATIONS

This application is the U.S. National Phase Application of PCT International Application No. PCT/EP2019/076653, filed Oct. 1, 2019, which claims priority to German Patent Application No. 10 2018 217 082.7, filed Oct. 5, 2018, the contents of such applications being incorporated by reference herein.

FIELD OF THE INVENTION

The invention relates to a method and a device for preparing a transmission of energy to a vehicle by means of an inductive charging system. Said transmission of energy can be provided to charge an energy store of the vehicle and/or to supply power to electrical consumers of the vehicle.

BACKGROUND OF THE INVENTION

When an energy store of a vehicle is charged by means of an inductive charging system, energy is transmitted inductively from a charging station to a vehicle in a wireless manner using a transmitter associated with the charging station and a receiver associated with the vehicle. The transmitter usually has a base plate, inside of which a coil is provided, said coil being used to emit an alternating magnetic field. This is received by a vehicle-based receiver arranged above the base plate and converted into DC signals, which are used, for example, to charge a vehicle-based battery.

In order to design said transmission of energy in the best possible manner, it is necessary to carry out various preparation measures. These preparation measures include the most accurate possible positioning of the vehicle-based receiver above the coil of the base plate. These preparation measures also include checking whether the intermediate space between the base plate and the vehicle-based receiver is free from objects. These objects include any items and even any living beings. This object identification can be performed by motion detection.

US 2016/0178740 A1, incorporated herein by reference, discloses systems, methods and devices by means of which protection of living objects is intended to be achieved in the case of a wireless application of power transmission. Here, data, broadcast by means of radar, from a plurality of radar transceivers are received, responses in the received radar data from each of the plurality of radar transceivers are compared with one another, a presence of a vehicle at a first distance from the plurality of radar transceivers is determined based at least in part on a correlation of the responses received from each of the plurality of radar transceivers and portions of the received radar data corresponding to movements within a predetermined range of distances from the plurality of radar transceivers that includes the first distance are filtered when further objects are detected in the detection area. In one of the exemplary embodiments described in US 2016/0178740 A1, the radar signals emitted by a plurality of radar modules are reflected at a passive or active radar transponder fixed to a vehicle.

SUMMARY OF THE INVENTION

An aspect of the invention is an improved method for preparing a transmission of energy to a vehicle by means of an inductive charging system.

An aspect of the invention presents a method for preparing a transmission of energy to a vehicle by means of an inductive charging system, which has a base plate arranged on a primary side of the charging system and a secondary side arranged in or on the vehicle, wherein a first coil is provided in the base plate and a second coil is provided on the secondary side in a vehicle plate, which comprises the following steps:
energizing the second coil provided on the secondary side from a vehicle-based power source and
diagnosing the functionality of components arranged on the secondary side of the inductive charging system by evaluating the energization carried out on the secondary side of the inductive charging system.

The advantages consist of, in particular, in that the components arranged on the secondary side of the inductive charging system are used not only to receive the charging energy but also have other purposes. By evaluating the energization of the coil arranged on the secondary side of the inductive charging system from a vehicle-based power source, information is obtained that can be used for the purpose of improved preparation of the transmission of energy to a vehicle. For example, through secondary-side energization of the coil arranged on the secondary side of the inductive charging system it is possible to obtain information about the functionality of the components arranged on the secondary side of the inductive charging system. For this purpose, there is no need for any transmission of energy from the primary side to the secondary side. As a result, the identification of the functionality of the components of the inductive charging system that are arranged on the secondary side of the inductive charging system can even be performed when the vehicle that is to be charged is not yet in the vicinity of the primary side, that is to say in a distance range from the primary side in which there is not yet coupling between the primary-side coil and the secondary-side coil.

The information obtained on the secondary side about the functionality of the secondary-side components of the inductive charging system can where necessary be intermediately stored in a vehicle-based memory and transmitted to the primary side if there is sufficient coupling between the primary-side coil and the secondary-side coil. For example, after identification of the functional incapacity of one or more secondary-side components, a corresponding information signal or a corresponding control signal can be transmitted to the primary side, on the basis of which signal the charging process of the secondary-side battery is prevented from the offset.

BRIEF DESCRIPTION OF THE DRAWINGS

These and further advantageous characteristics of the invention will emerge from the exemplary explanation thereof below on the basis of the FIGURE. Said FIGURE shows a block diagram of an inductive vehicle charging system.

DETAILED DESCRIPTION OF THE PREFERRED EMBODIMENTS

The inductive vehicle charging system shown in the FIGURE has a charging station 1, which includes a control unit 2 and a base plate 3. A coil 4 is arranged in the base plate 3. As an alternative to the exemplary embodiment shown in the FIGURE, the control unit 2 can also be an integrated component part of the base plate 3. The charging station 1 forms the primary side of the inductive charging system.

The FIGURE also illustrates a vehicle 5 in or on which the vehicle-based parts of the inductive vehicle charging system are arranged. The vehicle-based parts of the inductive charging system form the secondary side of the inductive charging system. Said vehicle-based parts include, inter alia, a receiver circuit 23 arranged in a vehicle plate 6 and necessary for the transmission of energy, a rectifier 10, a voltmeter 11, a filter capacitor 12, an ammeter 13, a discharging arrangement 14 and an energy store 18. The receiver circuit 23 contains a coil 7 and capacitors 8 and 9, which together with the coil 7 form a resonant circuit. The discharging arrangement 14, which from the point of view of the second coil 7 is arranged downstream of the voltmeter 11 and also downstream of the ammeter 13, that is to say is arranged directly upstream of the energy store 18, has an ohmic resistance 15, a transistor 16 and a diode 17.

By means of the inductive charging system illustrated in the Figure, energy can be transmitted wirelessly from the charging station 1 to the vehicle 5 using a transmitter, which is the coil 4 arranged in the base plate 3 and is associated with the charging station, and the vehicle-based receiver circuit 23, which includes the coil 7 and the capacitors 8 and 9.

The coil 7 is connected via the capacitors 8 and 9 to the rectifier 10, in which the signal received by the receiver circuit 23 is rectified.

The output signal of the rectifier 10 is fed via the filter capacitor 12 to the discharging arrangement 14, which has the ohmic resistance 15, the transistor 16 and the diode 17. The energy store 18, in which the transmitted energy is stored, is connected to said discharging arrangement 14.

As part of preparing a charging of the energy store 18 of the vehicle 5 by means of the inductive charging system shown, the coil 7 arranged on the secondary side is energized from a vehicle-based power source 21. Said vehicle-based power source may be the low-voltage on-board electrical system of the vehicle 5. As an alternative thereto, a battery arranged in the vehicle, for example the battery 18, can also be used as the vehicle-based power source.

The vehicle-based power source 21 is connected to the coil 7 via diodes 19 and 20 and the already mentioned capacitors 8 and 9 in order to energize said coil. Said energization process is controlled by a vehicle-based control unit 22, which feeds control signals s2 to the power source, said control signals being used to control the operation of the power source. The control unit is furthermore designed to provide control signals s1 for controlling the transistor 16 of the discharging arrangement 14.

The energization of the second coil 7 by the vehicle-based power source 21 is evaluated on the secondary side of the inductive charging system using the output signals of the voltmeter 11 and the ammeter 13 in order to obtain information about the functionality of the secondary-side components of the inductive charging system.

As part of said evaluation, the functionality of the second coil 7 arranged on the secondary side of the inductive charging system is diagnosed. The resonant behavior of the second coil is checked here. A check is also carried out to determine whether there is a short circuit of the second coil and whether one or more of the connection terminals of the second coil are open.

As part of said evaluation, the functionality of the rectifier 10 is also checked. Here, a check is carried out to determine whether there is a short circuit in the rectifier. Said check is performed using a connection and disconnection process of the energization of the second coil 7.

As part of said evaluation, the functionality of the filter capacitor 14 is also checked. This is carried out by checking the discharging behavior of the filter capacitor.

As part of said evaluation, the functionality of the discharging arrangement 14 is also checked. Said check can also be performed using a connection and disconnection process of the energization of the second coil.

If it is identified as part of said evaluation of the energization of the second coil 7 performed by the control unit 22 that one or more components of the secondary side of the inductive charging system are functionally inoperative, the control unit 22 produces an information signal that signals said functional incapacity. Said information signal is transmitted to the primary side and there it is forwarded on to the primary-side control unit 2. As a reaction to the reception of said information signal, said primary-side control unit suppresses the intended charging process in order to prevent damage from occurring in the vehicle.

After all that, in the present invention, as part of preparing a transmission of energy to a vehicle by means of an inductive charging system, the functionality of the vehicle-based components of the inductive charging system is diagnosed on the secondary side of the inductive charging system. For said diagnosis, it is not necessary for there to already be a close coupling of the base-side first coil of the inductive charging system to the vehicle-based second coil of the inductive charging system. The mentioned functional diagnosis is carried out independently of the primary side of the inductive charging system, wherein a vehicle-based power source is used to energize the vehicle-based second coil and wherein an evaluation of said energization of the vehicle-based second coil is performed in the vehicle. In said evaluation, in particular the functionality of the second coil 7, the rectifier 10, the filter capacitor 12 and the discharging arrangement 14 is checked. The result of said evaluation can be reported to the primary-side control unit 2. In the event of a functional incapacity of one or more vehicle-based components of the inductive charging system, said primary-side control unit suppresses a transmission of energy from the primary side to the secondary side. This prevents damage from occurring in the vehicle.

A further possibility consists in providing a bidirectional possibility for charging and discharging. As a result, there is also the possibility of transmitting energy from the vehicle to the base station.

The invention claimed is:

1. A method for preparing a transmission of energy to a vehicle by an inductive charging system, which has a base plate arranged on a primary side of the charging system and a secondary side arranged in or on the vehicle, wherein a first coil is provided in the base plate and a second coil is provided on the secondary side in a vehicle plate, comprising:
    energizing the second coil provided on the secondary side from a vehicle-based power sources; and
    diagnosing the functionality of components arranged on the secondary side of the inductive charging system by evaluating the energization carried out on the secondary side of the inductive charging system,
    wherein the diagnosing the functionality of components arranged on the secondary side of the inductive charging system includes diagnosing the functionality of a discharging arrangement arranged on the secondary side of the inductive charging system,
wherein the discharging arrangement comprises a resistor and a transistor,
wherein a resonator circuit on the secondary side comprising the second coil is connected to a rectifier, and
wherein the rectifier is connected to an energy store via the discharging arrangement.

2. The method as claimed in claim 1, in which the functionality of the second coil arranged on the secondary side of the inductive charging system is diagnosed.

3. The method as claimed in claim 2, in which the functionality of the second coil arranged on the secondary side of the inductive charging system is diagnosed in respect of a presence of a short circuit and/or in respect of a presence of one or more open terminals.

4. The method as claimed in claim 2, in which the functionality of the second coil arranged on the secondary side of the inductive charging system is diagnosed in respect of the resonant behavior thereof.

5. The method as claimed in claim 3, in which the functionality of the second coil arranged on the secondary side of the inductive charging system is diagnosed in respect of the resonant behavior thereof.

6. The method as claimed in claim 1, in which the functionality of a rectifier arranged on the secondary side of the inductive charging system is diagnosed.

7. The method as claimed in claim 1, in which the functionality of a filter capacitor arranged on the secondary side of the inductive charging system is diagnosed.

8. The method as claimed in claim 1, in which the energization of the second coil provided on the secondary side is controlled by a control unit arranged in the vehicle and the diagnosis of the functionality of the components arranged on the secondary side of the inductive charging system is performed by the control unit arranged in the vehicle.

9. The method as claimed in claim 1, in which, upon identification of a functional incapacity of one of the components arranged on the secondary side of the inductive charging system, the control unit arranged in the vehicle initiates an output of an information signal indicating the functional incapacity of one of the components arranged on the secondary side of the inductive charging system.

10. The method as claimed in claim 1, in which the second coil provided on the secondary side is energized from a low-voltage on-board electrical system of the vehicle.

11. The method as claimed in claim 1, in which the second coil provided on the secondary side is energized from a vehicle battery.

12. The method as claimed in claim 1, wherein the discharging arrangement further comprises a diode.

13. A device for preparing a transmission of energy to a vehicle by an inductive charging system, which has a base plate arranged on a primary side of the charging system and a secondary side arranged in or on the vehicle, wherein a first coil is provided in the base plate and a second coil is provided on the secondary side in a vehicle plate, wherein the device furthermore comprises:
a vehicle-based power source, which is designed to energize the second coil provided on the secondary side, and
a vehicle-based control unit, which is designed to control the energization of the second coil provided on the secondary side and to diagnose the functionality of components arranged on the secondary side of the inductive charging system by evaluating the energization carried out,
wherein the vehicle-based control unit is designed to diagnose the functionality of a discharging arrangement arranged on the secondary side of the inductive charging system,
wherein the discharging arrangement comprises a resistor and a transistor,
wherein a resonator circuit on the secondary side comprising the second coil is connected to a rectifier, and
wherein the rectifier is connected to an energy store via the discharging arrangement.

14. The device as claimed in claim 13, in which on the secondary side capacitors are connected to the second coil and form a resonator the resonant circuit together with the second coil.

15. The device as claimed in claim 14, wherein a filter capacitor is connected to the output of the rectifier.

16. The device as claimed in claim 15, further comprising a voltmeter connected to the rectifier.

17. The device as claimed in claim 16, which has an ammeter, which is arranged between the filter capacitor and the discharging arrangement.

18. The device as claimed in claim 15, which has an ammeter, which is arranged between the filter capacitor and the discharging arrangement.

19. The apparatus as claimed in claim 15, in which the discharging arrangement has a transistor controlled by the control unit.

* * * * *

UNITED STATES PATENT AND TRADEMARK OFFICE
CERTIFICATE OF CORRECTION

PATENT NO. : 11,958,369 B2  
APPLICATION NO. : 17/282088  
DATED : April 16, 2024  
INVENTOR(S) : Urs Kalt, Andrees Beekmans and Bernhard Michel Page 1 of 1

It is certified that error appears in the above-identified patent and that said Letters Patent is hereby corrected as shown below:

In the Claims

In Column 4, Line 60 in Claim 1 the word "sources;" should read -- source; --.

In Column 4, Line 33 in Claim 14 delete the word "a resonator".

Signed and Sealed this  
First Day of April, 2025

Coke Morgan Stewart  
*Acting Director of the United States Patent and Trademark Office*